United States Patent
Chiu

(10) Patent No.: US 9,008,376 B2
(45) Date of Patent: Apr. 14, 2015

(54) ULTRA-THIN SENSING DEVICE WITH FLAT CONTACT SURFACE

(71) Applicant: Mei-Yen Lee, Hsin Chu (TW)

(72) Inventor: Li-Kuo Chiu, Taipei (TW)

(73) Assignee: J-Metrics Technology Co., Ltd., Taipei (TW)

( * ) Notice: Subject to any disclaimer, the term of this patent is extended or adjusted under 35 U.S.C. 154(b) by 0 days.

(21) Appl. No.: 14/302,933

(22) Filed: Jun. 12, 2014

(65) Prior Publication Data

US 2014/0369573 A1 Dec. 18, 2014

(30) Foreign Application Priority Data

Jun. 17, 2013 (TW) .............................. 102121282 A

(51) Int. Cl.
*G06K 9/00* (2006.01)

(52) U.S. Cl.
CPC .................................. *G06K 9/00013* (2013.01)

(58) Field of Classification Search
CPC .............. G06K 9/00013; G06F 3/0488; G06F 3/04883; G06F 3/044; G06F 3/03547; G06F 21/32; G01R 27/2605; G07C 2009/00095; G11C 11/24; G11C 27/028
See application file for complete search history.

(56) References Cited

U.S. PATENT DOCUMENTS

| | | | |
|---|---|---|---|
| 2011/0068387 A1* | 3/2011 | Kitamura | 257/329 |
| 2014/0140588 A1* | 5/2014 | Chou | 382/124 |
| 2015/0030217 A1* | 1/2015 | Wickboldt et al. | 382/124 |

* cited by examiner

*Primary Examiner* — Edward Park
(74) *Attorney, Agent, or Firm* — Muncy, Geissler, Olds & Lowe, P.C.

(57) ABSTRACT

An ultra-thin sensing device with a flat contact surface comprises a package substrate, an interposer structure, a vertical electrical connection structure and a sensing chip. The interposer structure disposed on the package substrate comprises connection pads and second bonding pads electrically connected to the connection pads and first bonding pads of the package substrate. The vertical electrical connection structure disposed on the interposer structure comprises vertical conductors electrically connected to the connection pads. The sensing chip disposed on the vertical electrical connection structure comprises a chip substrate, and sensing members, sensing circuit cells and vertical through electrodes, which are formed on the chip substrate. The sensing member senses specific features of an organism to obtain sensing signals, processed by the sensing circuit cells into biometrics feature signals transmitted to the first bonding pad through the vertical through electrode, the vertical conductor and the second bonding pad.

10 Claims, 12 Drawing Sheets

ULTRA-THIN SENSING DEVICE WITH FLAT CONTACT SURFACE

This application claims priority of No. 102121282 filed in Taiwan R.O.C. on Jun. 17, 2013 under 35 USC 119, the entire content of which is hereby incorporated by reference.

BACKGROUND OF THE INVENTION

1. Field of the Invention

The invention relates in general to an ultra-thin sensing device with a flat contact surface, and more particularly to an ultra-thin sensing device, which has a flat contact surface and has a sensing chip using vertical through electrodes.

2. Related Art

Recently, mobile devices, such as mobile phones, tablet computers or smart watches, are increasingly developed, and the thickness of the mobile device is getting thinner and thinner. Correspondingly, the thickness of the integrated circuit (IC) package used in the mobile device is requested to be thin. In addition, users have paid more and more attention to the outlooks of the mobile devices. So, if a sensor, such as a fingerprint sensor, is to be mounted on the mobile device, the sensor must not damage the outlook of the mobile device. Consequently, the sensor must have an all-flat (fully flat) design and a considerably thin thickness, so that the sensor can be hidden in, for example, a front or rear cover or a button of the mobile device.

In a conventional capacitive/electric field fingerprint sensor, sensing circuits and sensing members are formed on a silicon substrate, on which output/input bonding pads are also formed, wherein the bonding pads on the silicon substrate are electrically connected to package bonding pads on the package substrate by way of wire bonding, and then the encapsulating process to produce a fingerprint sensor device. However, under the restriction of the existing wire-bonding technology, the wire inevitably has an arc section curved upwardly from the bonding pad, and this arc section is disadvantageous to the all-flat sensor, and the sum of the height of the arc and the height of the encapsulating layer is greater than 100 microns. This is also disadvantageous to the ultra-thin design. In addition, the encapsulating layer with the height of 100 microns also significantly decreases the sensing capacitance and thus affects the sensitivity. Thus, it is improper for the sensing device to be hidden in the front/rear cover or button of the mobile device.

In another fingerprint sensor, solder balls of a ball grid array (BGA) are used to bond the silicon substrate of the chip to the package substrate. However, the diameter of the solder ball generally ranges from 300 to 400 microns (um). The total thickness of the fingerprint sensor is substantially equal to the sum of the diameter of the solder ball, the thickness of the chip and the thickness of the package substrate, and is inevitably greater than 700 um or even 1000 um. This is disadvantageous to the requirement of the thinned product.

SUMMARY OF THE INVENTION

It is therefore an object of the invention to provide an ultra-thin sensing device with a flat contact surface, wherein a sensing chip with vertical through electrodes and associated connection structures are adopted to complete the ultra-thin sensing device.

To achieve the above-identified object, the invention provides an ultra-thin sensing device with a flat contact surface. The sensing device comprises a package substrate, an interposer structure, a vertical electrical connection structure and a sensing chip. The package substrate comprises first bonding pads. The interposer structure is disposed on the package substrate and comprises connection pads and second bonding pads electrically connected to the first bonding pads and the connection pads. The vertical electrical connection structure is disposed on the interposer structure and comprises vertical conductors electrically connected to the connection pads. The sensing chip is disposed on the vertical electrical connection structure and comprises a chip substrate, and sensing members, sensing circuit cells and vertical through electrodes, all of which are formed on the chip substrate. The sensing members constituting a sensing member array sense specific features of an organism to obtain sensing signals. The sensing circuit cells, constituting a sensing circuit cell array and electrically connected to the sensing members, process the sensing signals into biometrics feature signals. The vertical through electrodes are directly or indirectly electrically connected to the sensing circuit cells and the vertical conductors, so that the biometrics feature signals are transmitted to the first bonding pads through the vertical through electrodes, the vertical conductors and the second bonding pads, respectively.

The invention further provides a method of manufacturing a sensing device. The method comprises the steps of: (a) forming sensing chips each having a chip substrate and sensing members, sensing circuit cells and vertical through electrodes formed in the chip substrate, wherein the sensing circuit cells are electrically connected to the vertical through electrodes and the sensing members; (b) forming a redistribution layer on the vertical through electrodes and forming vertical conductors on the redistribution layer; (c) forming an interposer wafer having connection pads and second bonding pads electrically connected to the connection pads; (d) placing the sensing chips on the interposer wafer with the vertical conductors being aligned with the connection pads; (e) bonding the vertical conductors to the connection pads; (f) forming an insulation filler layer between the sensing chips and the interposer wafer; (g) performing a dicing process to form sensors; (h) placing the sensor on a package substrate comprising first bonding pads; and (i) performing wire-bonding and encapsulating processes on the sensor to electrically connect the first bonding pads to the second bonding pads and form the sensing device.

According to the above-mentioned aspects of the invention, the thickness of the sensing device can be effectively decreased, so that the sensing device and the electronic apparatus having the sensing device can be thinned.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
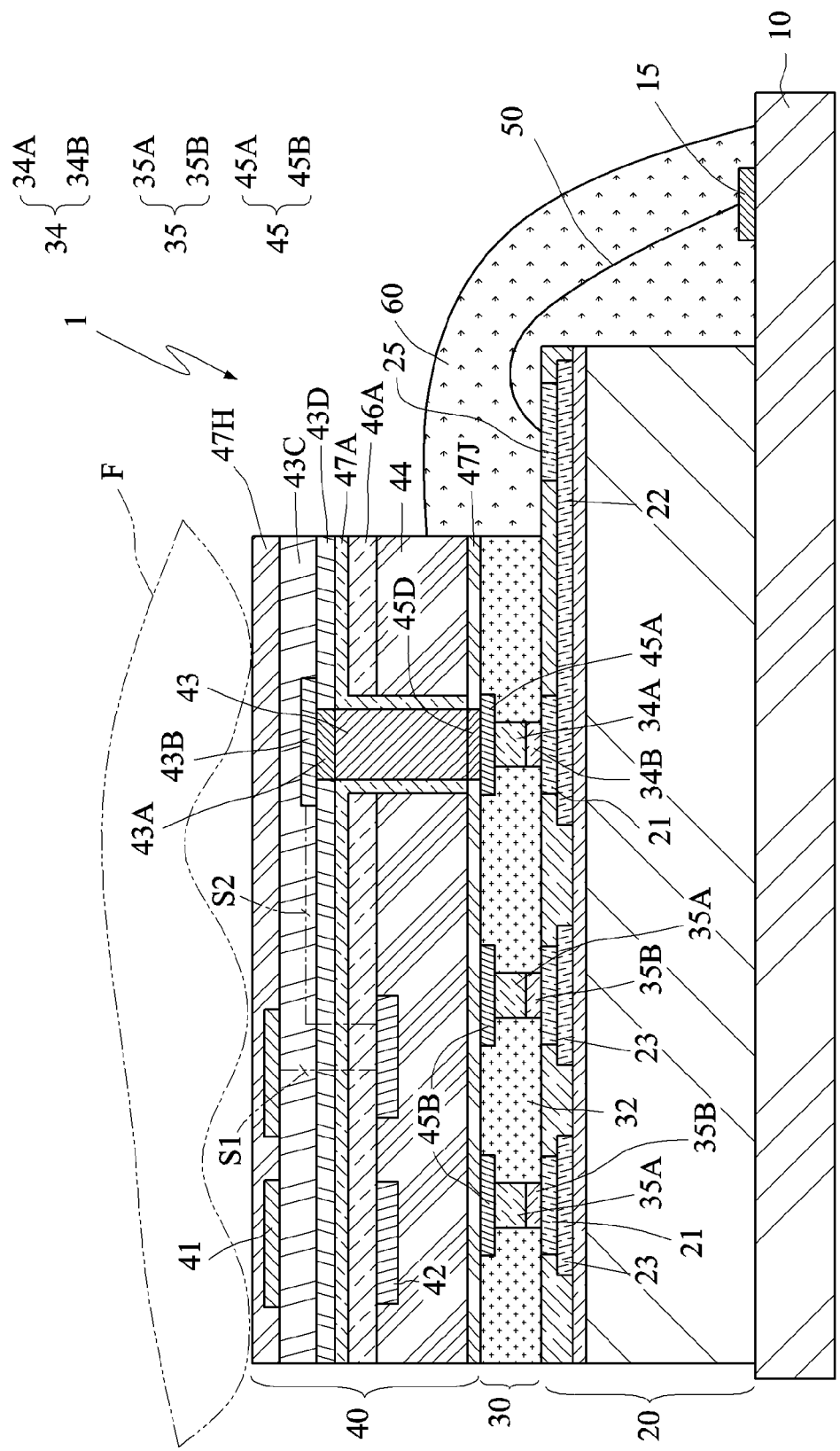
FIG. 1 is a partial schematic view showing a sensing device according to a first embodiment of the invention.

FIG. 1 is a partial schematic view showing a sensing device 1 according to a first embodiment of the invention. Referring to FIG. 1, the ultra-thin sensing device 1 with a flat contact surface according to this embodiment comprises a package substrate 10, an interposer structure 20, a vertical electrical connection structure 30 and a sensing chip 40. In one exemplary but not-limitative example, the thickness of the sensing device 1 in the vertical direction of the drawing is smaller than or equal to 500 microns.

The package substrate 10 comprises first bonding pads 15. In one example, the package substrate 10 is preferably a flexible circuit board. In another example, the package substrate 10 may be a printed circuit board having a single-layer or multi-layer metal structure.

The interposer structure 20 disposed on the package substrate 10 comprises connection pads 21 and second bonding pads 25 electrically connected to the first bonding pads 15 and the connection pads 21. In this example, each of some connection pads 21 is electrically connected to the second bonding pad 25 through the conductor layer 22 below the connection pad 21, and other connection pads 21 are electrically connected to the conductor layer 23 therebelow. The conductor layers 22 and 23 may be formed in the same metal manufacturing process.

The interposer structure is a silicon interposer structure in this embodiment, and of course may also be the interposer structure formed of glass, ceramics or any other material in another embodiment. The significant advantage of using the silicon interposer structure resides in that the advancing development of the semiconductor manufacturing process can be fully utilized, so that the fine microbump manufacturing process for this invention can be completed. This is also an important feature of this invention and will be further described in the following.

The vertical electrical connection structure 30 disposed on the interposer structure 20 comprises an insulation filler layer 32 and vertical conductors 34, which are buried in the insulation filler layer 32 and electrically connected to the connection pads 21. In this embodiment, the vertical conductor 34 is mainly constituted by a conductor column 34A and a microbump 34B. In an exemplary but not-limitative example, the vertical conductor 34 is formed by one, two or more than two of copper, nickel, silver, gold, palladium and solder.

The sensing chip 40 disposed on the vertical electrical connection structure 30 comprises a chip substrate 44, and sensing members 41, sensing circuit cells 42 and vertical through electrodes 43, wherein the sensing members 41, the sensing circuit cells 42 and the vertical through electrodes 43 are formed on the chip substrate 44. A second insulating layer 47J is formed between the chip substrate 44 and the insulation filler layer 32.

The sensing members 41 constituting a sensing member array sense specific features of an organism to obtain sensing signals S1. In this embodiment to be described, the sensing members 41 sense the fingerprint of a finger F to generate the sensing signals. However, in addition to the fingerprint sensing of the finger F, it is to be understood that the sensing device of the invention may also sense electrical signals generated when the organism is in contact with or approaching to the sensing device. For example, the sensing device may function as a touch sensor or to sense the skin's humidity, the skin's temperature, the blood composition under the skin, the vein distribution pattern under the skin, or the like. That is, the sensing members 41 of the invention may sense the biometrics features of the organism. The biometrics features are preferably unique to the person (single-finger or multi-finger touch are not unique to the person). However, the invention is not particularly restricted thereto. In a best but non-restrictive embodiment, the sensing member senses the change of the capacitance or electric field.

The sensing circuit cells 42 constituting a sensing circuit cell array are electrically connected to the sensing members 41 and process the sensing signals S1 to obtain biometrics feature signals S2. Of course, in addition to the sensing circuit cells, those skilled in the art should understand that one sensing chip may comprise more analog and digital circuits and power and signal transmission interfaces to be electrically connected to external devices.

The vertical through electrodes 43 are directly or indirectly electrically connected to the sensing circuit cells 42 and the vertical conductors 34, so that the biometrics feature signals S2 are transmitted to the first bonding pads 15 through the vertical through electrodes 43, the vertical conductors 34 and the second bonding pads 25, respectively. Thus, the vertical through electrodes 43, the vertical conductors 34 and the second bonding pads 25 may be referred to as a power and signal transmission interface. In this example, the vertical through electrode 43 is directly or indirectly electrically connected to the sensing circuit cell 42 through a conductor 43A and a conductor 43B, and this may be implemented by way of through-silicon via (TSV). An inter-layer dielectric layer 46A is disposed on the chip substrate 44, a first insulating layer 47A is disposed around the vertical through electrode 43 and on the inter-layer dielectric layer 46A, and an insulating layer 43D is formed on the first insulating layer 47A and disposed around the conductor 43A. The conductor 43B is formed on the conductor 43A, an inter-metal dielectric layer 43C is formed on the insulating layer 43D and the conductor 43B. The sensing member 41 is formed on the inter-metal dielectric layer 43C, and a passivation layer 47H covers the sensing member 41 and the inter-metal dielectric layer 43C.

In addition, the sensing device 1 may further comprise wires 50 and an encapsulating layer 60. The wires 50 electrically connect the first bonding pads 15 to the second bonding pads 25, respectively. The encapsulating layer 60 covers the first bonding pads 15, the second bonding pads 25 and the wires 50. Because the invention provides a fully flat contact surface, the outermost height of the combination of the wire and the encapsulating layer is smaller than the height of the passivation layer 47H.

In addition, the sensing chip 40 may further comprise a redistribution layer 45, and the vertical through electrodes 43 are electrically connected to the vertical conductors 34 through conductors 45A and conductors 45D of the redistribution layer 45. In this case, the vertical electrical connection structure 30 further comprises dummy electroconductive structures 35. The dummy electroconductive structure 35 has the structure similar to that of the vertical conductor 34, and is similarly constituted by a conductor column 35A and a microbump 35B. The dummy electroconductive structure 35 is electrically connected to a conductor 45B of the redistribution layer 45. The dummy electroconductive structure 35 does not transmit any signal, but can stabilize the connection relationship between the sensing chip 40 and the interposer structure 20.

FIGS. 2A to 2M are partial schematic views showing structures in some steps of a method of manufacturing the sensing device of FIG. 1 according to the preferred embodiment. The method of manufacturing the sensing device of this embodiment comprises the following steps. Of course, the manufacturing method of the preferred embodiment is provided only for the illustrative purpose without restricting the invention.

First, as shown in FIGS. 2A to 2K, sensing chips 40 are formed. Each sensing chip 40 has a chip substrate 44 and sensing members 41, sensing circuit cells 42 and vertical through electrodes 43 formed in the chip substrate 44. The sensing circuit cells 42 are electrically connected to the vertical through electrodes 43 and the sensing members 41.

The details of one example of forming multiple sensing chips 40 will be described in the following.

Figure 2A:
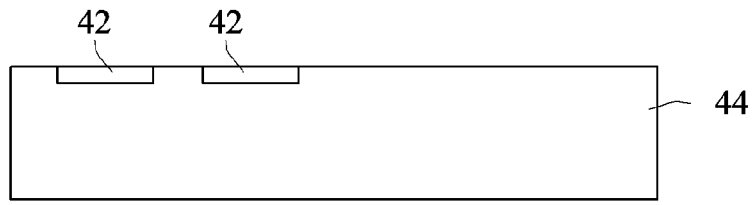
FIGS. 2A to 2M are partial schematic views showing structures in some steps of a method of manufacturing the sensing device of FIG. 1 according to the preferred embodiment.
Figure 2B:
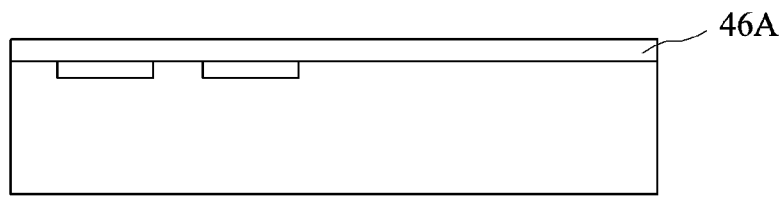
Figure 2C:
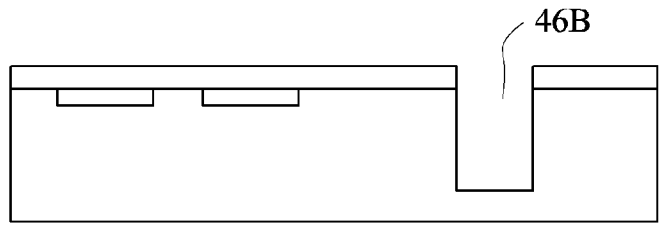
Figure 2D:
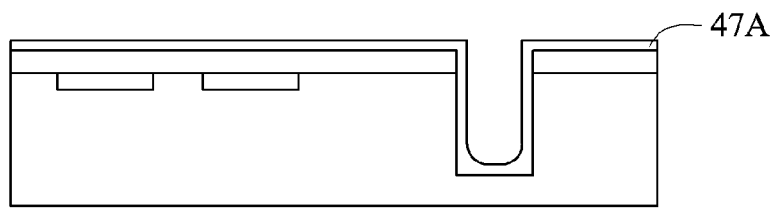
Figure 2E:
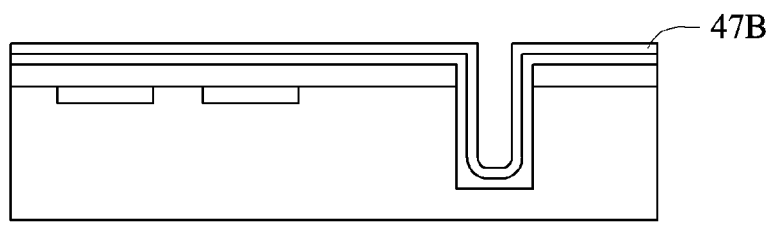
Figure 2F:
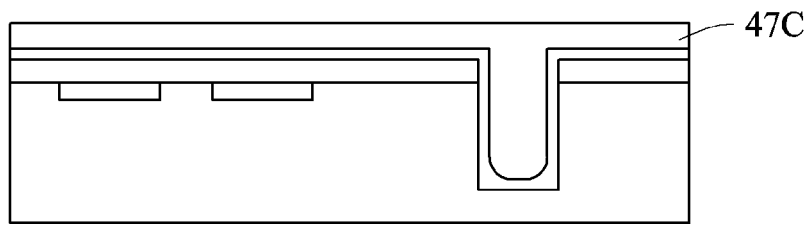

First, as shown in FIG. 2A, the sensing circuit cells 42 are formed on the chip substrate 44. Then, as shown in FIG. 2B, an inter-layer dielectric layer 46A is formed on the chip substrate 44 and the sensing circuit cells 42. Next, as shown in FIG. 2C, the through holes 46B, which penetrate through the inter-layer dielectric layer 46A and extend to the chip substrate 44 by a predetermined depth, are formed. Then, as shown in FIG. 2D, a first insulating layer 47A is formed on the inter-layer dielectric layer 46A and an inner wall of each through hole 46B. Next, as shown in FIG. 2E, a first copper seed layer 47B is formed on the first insulating layer 47A. Then, as shown in FIG. 2F, the first copper seed layer 47B is used to perform the plating to form a first copper layer 47C.

Figure 2G:
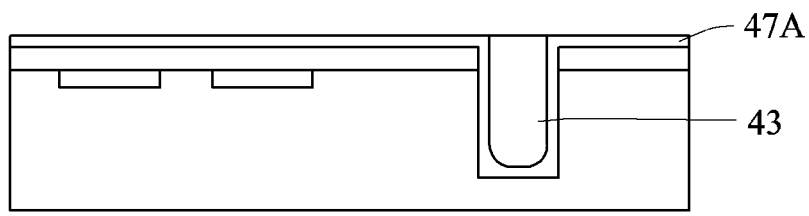
Figure 2H:
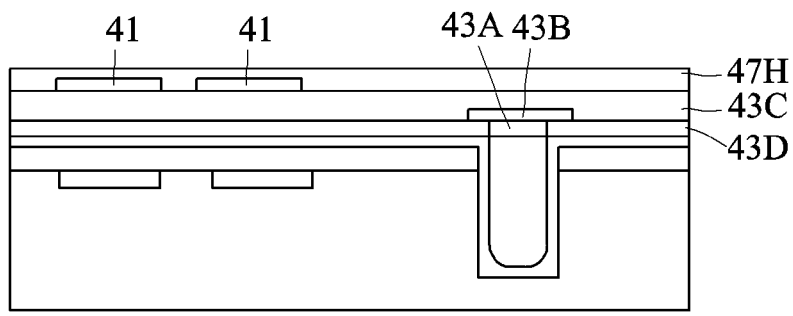

Next, as shown in FIG. 2G, a portion of the first copper layer 47C is removed by way of, for example, grinding until the first insulating layer 47A is exposed to form the vertical through electrodes 43. Then, as shown in FIG. 2H, the sensing members 41 are formed on the vertical through electrodes 43 and the first insulating layer 47A with the sensing members 41 being electrically connected to the vertical through electrodes 43 and being covered by the passivation layer 47H. For example, the insulating layer 43D may be firstly formed on the vertical through electrode 43, and then slotted or windowed for the formation of the conductor 43A. Then, a metal layer is formed on the conductor 43A and the insulating layer 43D, and then the metal layer is patterned to form the conductor 43B. Next, the sensing members 41 are formed on the inter-metal dielectric layer 43C, and then the passivation layer 47H covers the sensing members 41 and the inter-metal dielectric layer 43C. In this embodiment, the sensing member 41 is a sensing electrode, which is usually formed by the topmost metal of the manufacturing process.

Figure 2I:
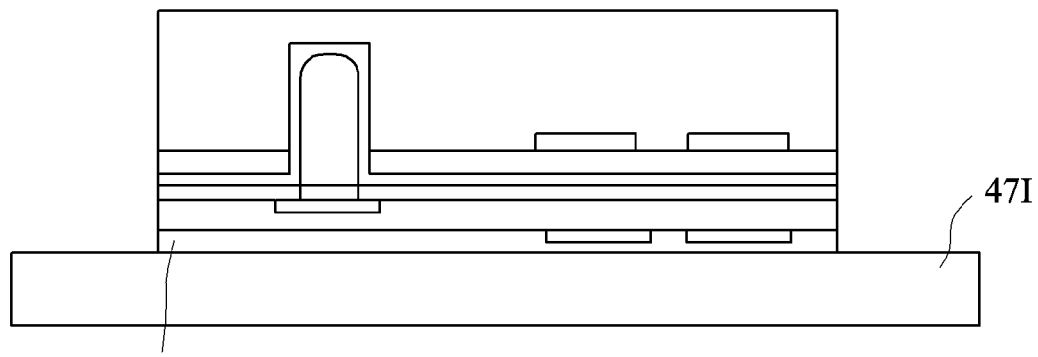
Figure 2J:
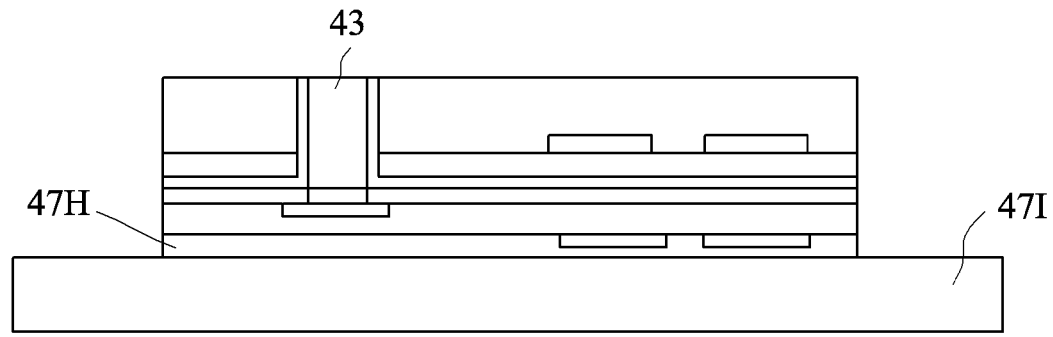
Figure 2K:
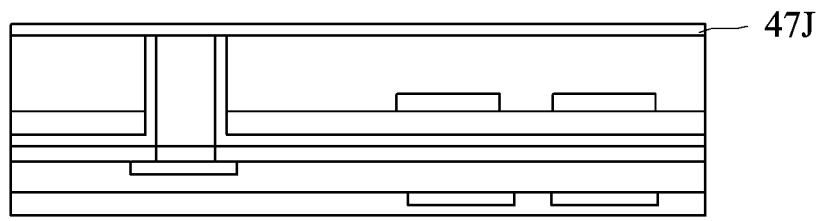

Then, as shown in FIG. 2I, a carrier 47I is adhered to the passivation layer 47H. Next, as shown in FIG. 2J, the chip substrate 44 is ground until the vertical through electrodes 43 are exposed. Then, as shown in FIG. 2K, the carrier 47I is removed and the second insulating layer 47J is formed on the chip substrate 44 and the vertical through electrodes 43.

Figure 2L:
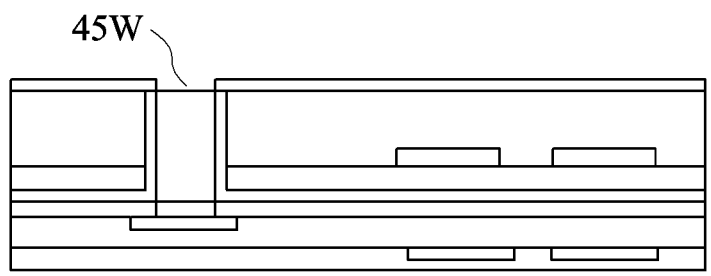
Figure 2M:
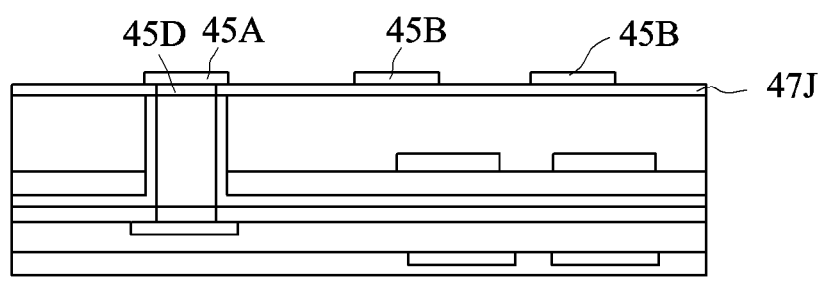

Next, as shown in FIGS. 2L to 2M and 3A to 3G, the redistribution layer 45 is formed on the vertical through electrodes 43, and the vertical conductors 34 is formed on the redistribution layer 45. First, as shown in FIG. 2L, the second insulating layer 47J is patterned to form windows 45W to expose the vertical through electrodes 43. Then, as shown in FIG. 2M, the conductor 45D is formed in each window 45W, and then the redistribution layer 45 electrically connected to the vertical through electrodes 43 is formed on the second insulating layer 47J. The redistribution layer 45 comprises the conductors 45A and the conductors 45B. Then, the conductors 45A are formed on the conductors 45D and the second insulating layer 47J, while the conductors 45B are formed on the second insulating layer 47J.

Figure 3A:
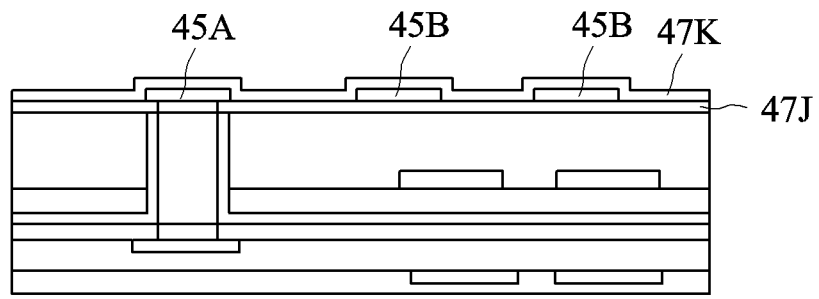
FIGS. 3A to 3M are partial schematic views showing structures in other steps of the method of manufacturing the sensing device of FIG. 1.
Figure 3B:
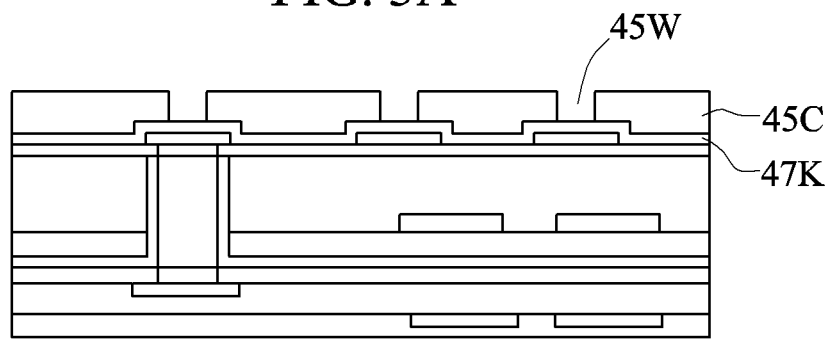
Figure 3C:
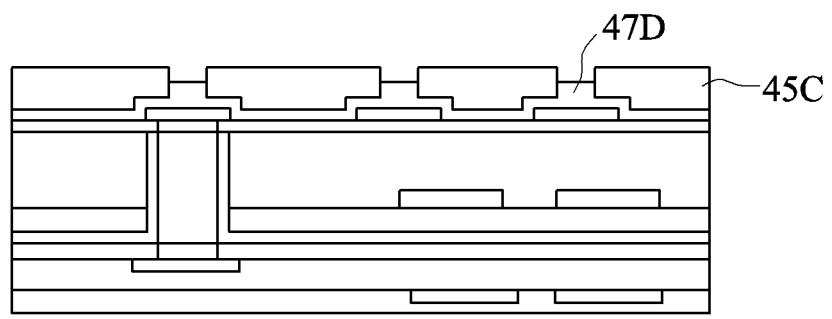

Then, as shown in FIG. 3A, a second copper seed layer 47K is formed on the redistribution layer 45 and the second insulating layer 47J. Next, as shown in FIGS. 3B and 3C, the second copper seed layer 47K is used to perform the plating to form a second copper layer 47D. In this example, a resist layer 45C is formed on the second copper seed layer 47K, and then patterned to form the windows 45W so that the range of growing the plated material can be defined, and the second copper layer 47D is formed. The window 45W is not fully filled by the second copper layer 47D.

Figure 3D:
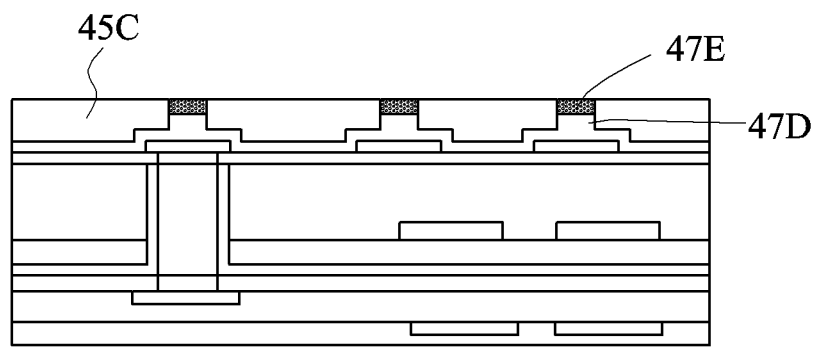
Figure 3E:
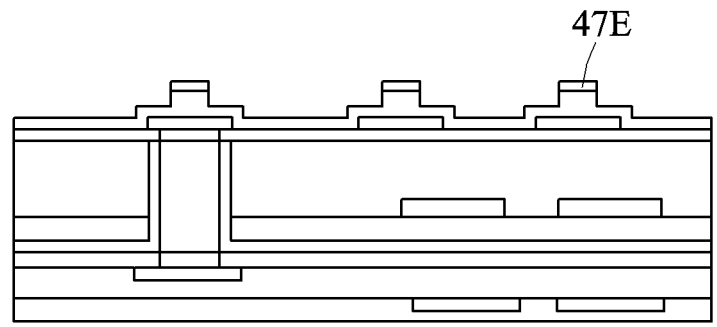
Figure 3F:
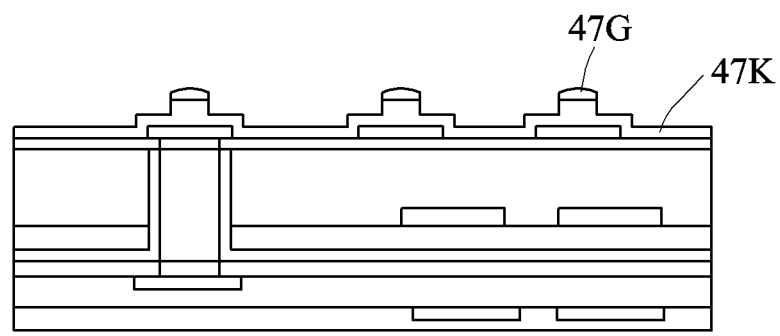
Figure 3G:
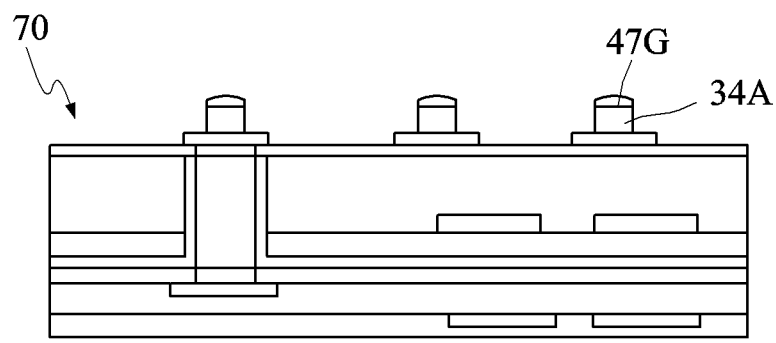

Then, as shown in FIGS. 3D to 3G, a solder layer 47G is formed on the second copper layer 47D, and a portion of second copper layer 47D is removed. In this example, solder 47E is filled into the window 45W and disposed on the second copper layer 47D, as shown in FIG. 3D. Then, the resist layer 45C is removed, as shown in FIG. 3E. Next, the solder 47E is reflowed to form the solder layer 47G, as shown in FIG. 3F. Finally, the redundant second copper seed layer 47K is removed to form the conductor column 34A and the solder layer 47G, as shown in FIG. 3G. The solder layer 47G serves as a solder cap, which is also a microbump (or ubump) to be aligned with and bonded to the connection pad 21, as will be described later. It is to be noted that the structure of FIG. 3G may be referred to as a composite sensing chip structure 70, which is similar to the combined structure of the sensing chip 40 and the vertical electrical connection structure 30 of FIG. 1. The microbump may be a solder bump, a copper bump or any other metal bump composed of, for example, gold, silver, nickel, tungsten, aluminum and alloys thereof. The bump serving as the lower connection portion and the bump serving as the upper connection portion may be bonded together by way of solder bonding or direct metal-metal (e.g., copper-copper) diffusion bonding.

Figure 3H:
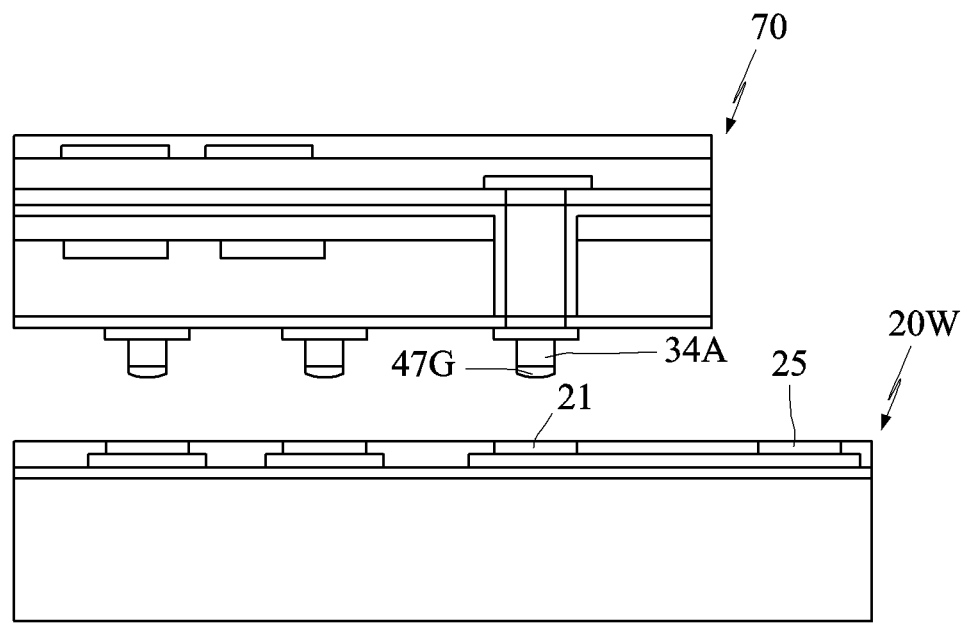

Thereafter, an interposer wafer 20W, which maybe be a passive wafer (with/without RLC components comprising a resistor, an inductor and a capacitor), an active wafer (with ICs) or a dummy wafer and has the connection pads 21 and the second bonding pads 25 electrically connected to the connection pads 21, is formed, as shown in FIG. 3H. In this embodiment, multiple composite sensing chip structures 70 are to be prepared and arranged in array on the interposer wafer 20W so that the bonding and package processes are performed. Then, the dicing process is performed to form multiple sensing devices 1. Therefore, the chip-on-wafer (COW) technology can be used to perform the mass production. Also, the production using the silicon interposer wafer is not restricted to the 8-inch or 12-inch wafer.

Figure 3I:
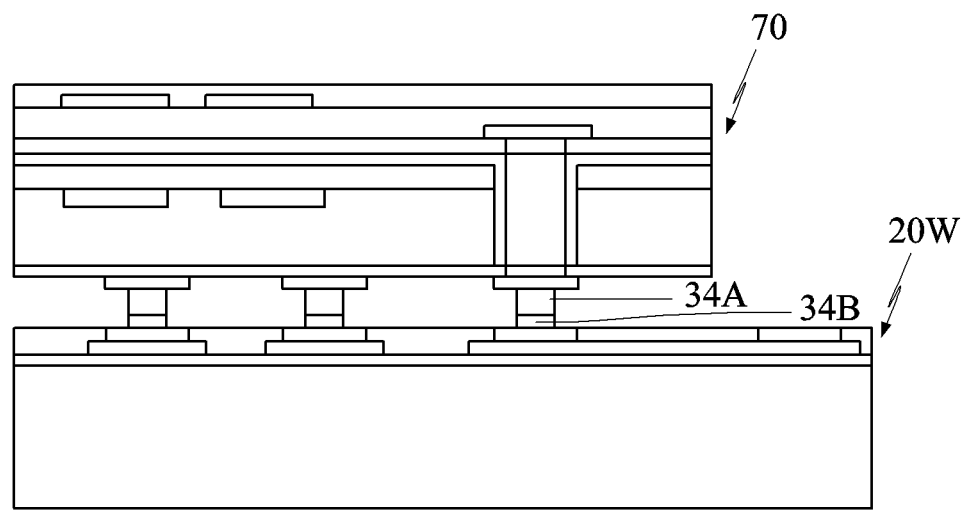

Next, multiples of the composite sensing chip structures 70 are placed on the interposer wafer 20W. That is, the sensing chips 40 are placed on the interposer wafer 20W with the conductor columns 34A of the vertical conductors 34 being aligned with the solder layer 47G and the connection pads 21, and the vertical conductors 34 are bonded to the connection pads 21, as shown in FIG. 3I.

Figure 3J:
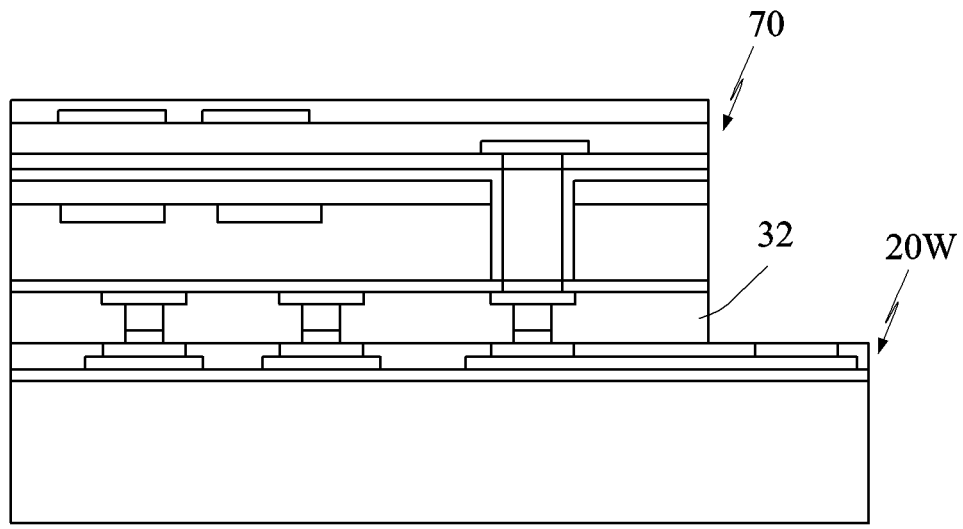

Then, as shown in FIG. 3J, an insulation filler layer 32 is formed between the sensing chips 40 and the interposer wafer 20W, and then cured or hardened. The insulation filler layer 32 may also be referred to as an underfill.

Figure 3K:
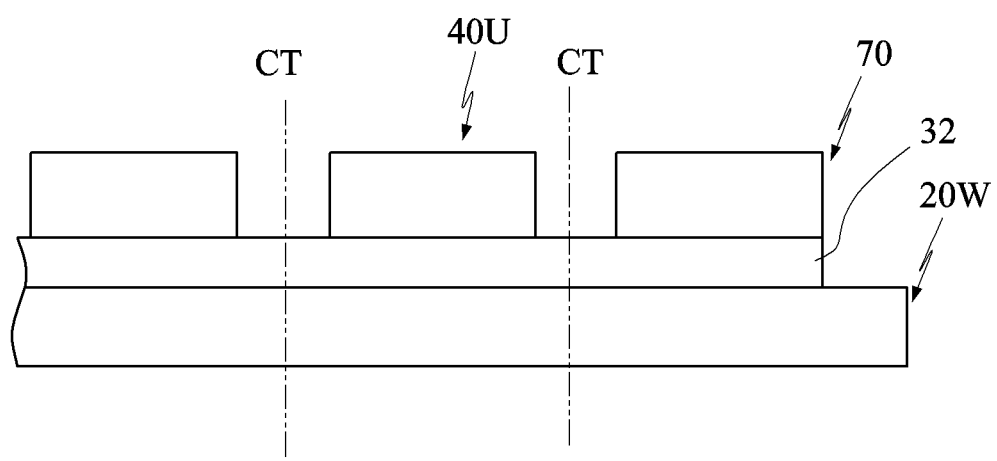
Figure 3L:
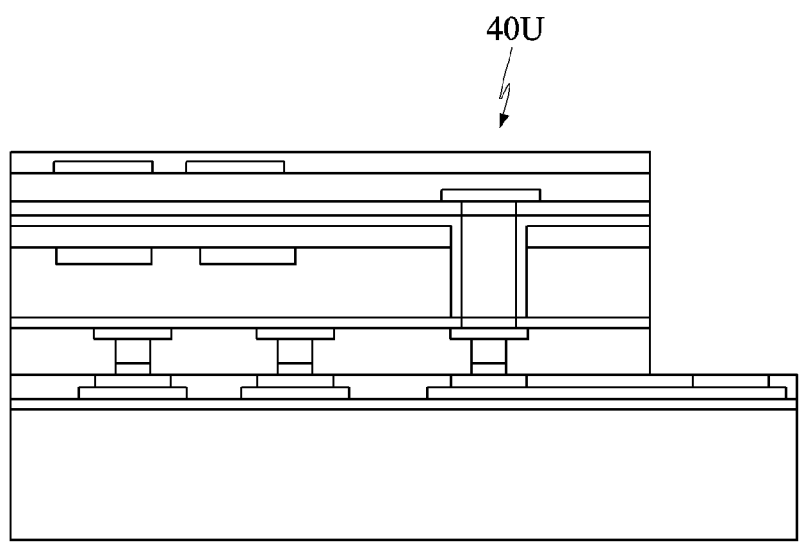

Next, as shown in FIG. 3K, a dicing process is performed along scribing lines CT to form sensors 40U, as shown in FIG. 3L.

Figure 3M:
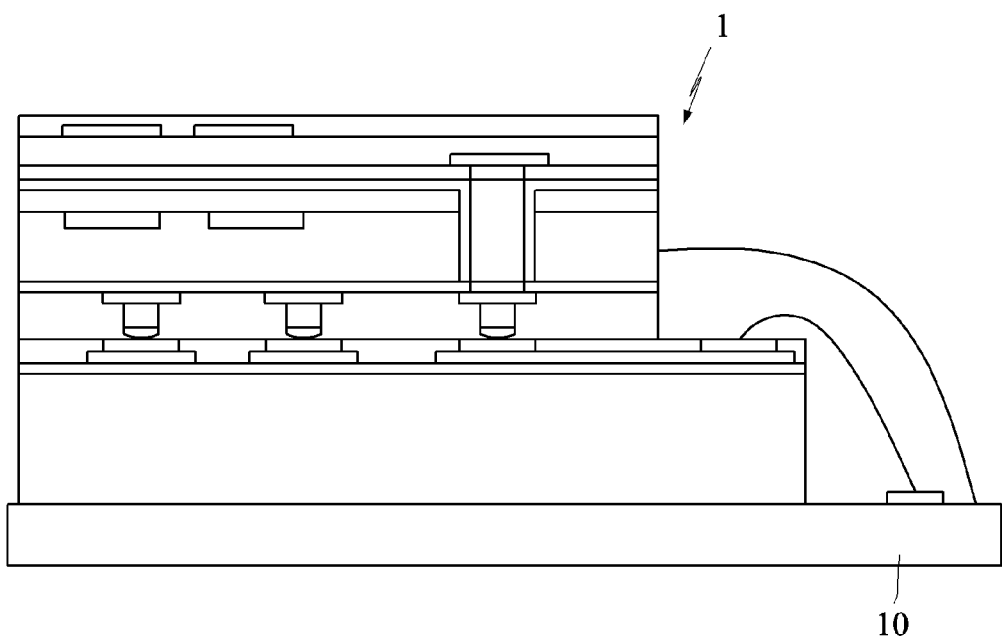

Then, as shown in FIG. 3M, the sensor 40U is placed on the package substrate 10, which comprises the first bonding pads 15. Next, the wire-bonding and encapsulating processes are performed on the sensor 40U, so that the first bonding pads 15 are electrically connected to the second bonding pads 25 and the sensing device 1 is formed. In the wire-bonding and encapsulating processes, the wires 50 are firstly provided to electrically connect the first bonding pads 15 to the second bonding pads 25, respectively, and then the encapsulating layer 60 is provided to cover the first bonding pads 15, the second bonding pads 25 and the wires 50.

Figure 4A:
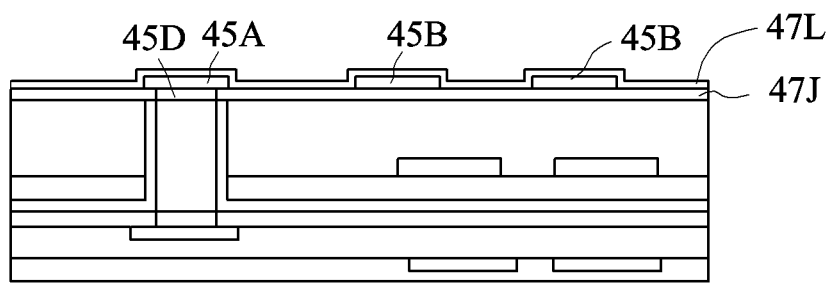
FIGS. 4A and 4B are schematic views showing some steps in a method of manufacturing a sensing device according to another embodiment of the invention.
Figure 4B:
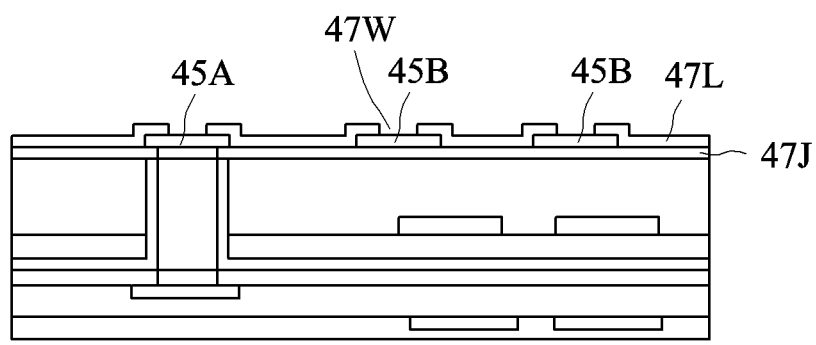

FIGS. 4A and 4B are schematic views showing some steps in a method of manufacturing a sensing device according to another embodiment of the invention. It is to be noted that FIGS. 4A and 4B are provided to replace the structure and manufacturing method of FIG. 2M, and that FIG. 4B can be followed by the manufacturing processes after FIG. 3A.

Thus, in this embodiment, as shown in FIG. 4A, a third insulating layer 47L is formed on the redistribution layer 45 and the second insulating layer 47J. Then, as shown in FIG. 4B, windows 47W are formed on the third insulating layer 47L to expose the redistribution layer 45. Next, as shown in FIG. 3I correspondingly, the second copper seed layer 47K is formed on the redistribution layer 45 and the third insulating layer 47L, and the second copper seed layer 47K is used to perform the plating process to form the second copper layer 47D. The solder layer 47G is formed on the second copper layer 47D and a portion of second copper layer 47D is removed so that the solder layer 47G serves as solder caps to be aligned with and bonded to the connection pads 21.

Figure 5:
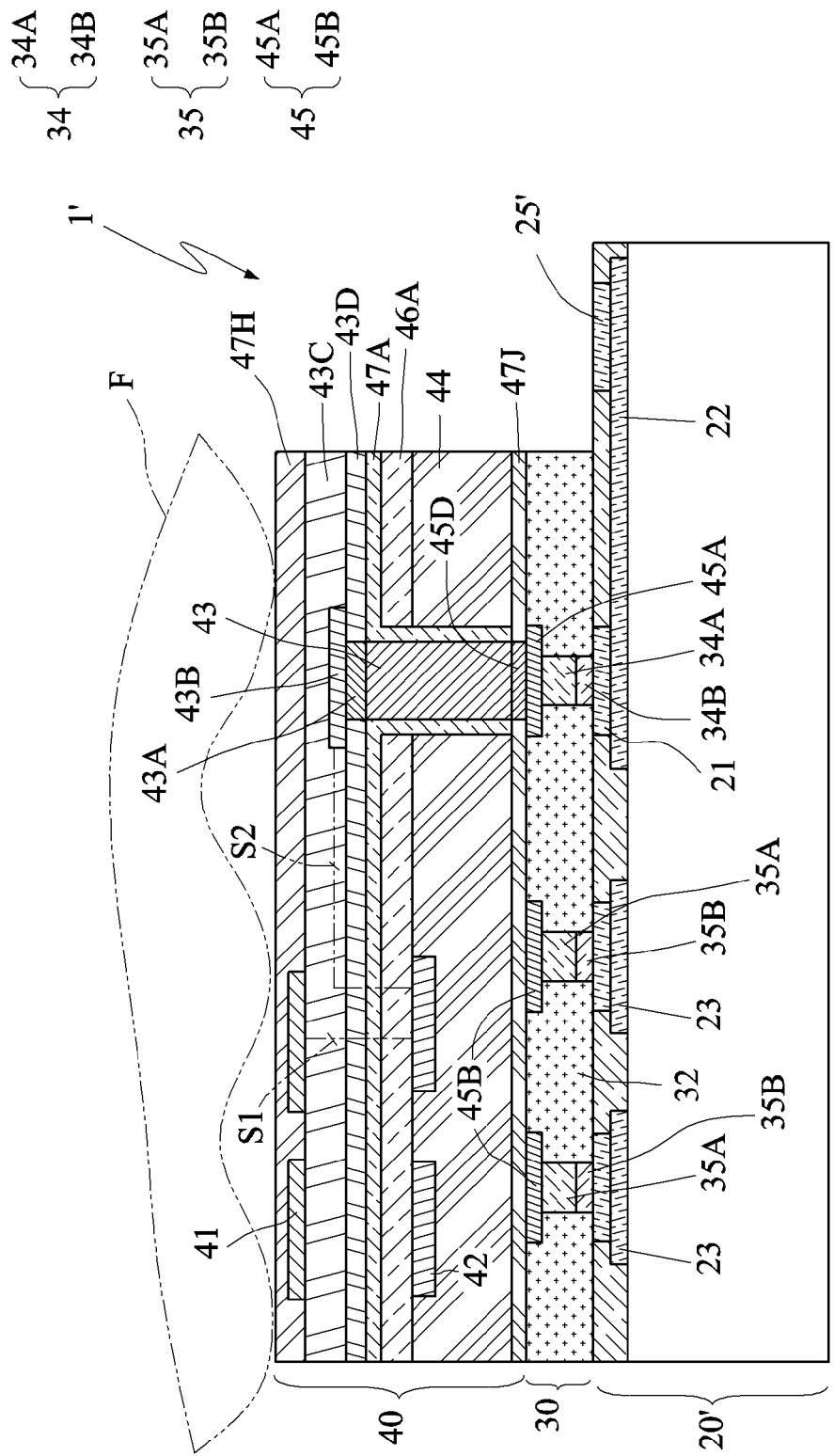
FIG. 5 is a schematic view showing a sensing device according to still another embodiment of the invention.

FIG. 5 is a schematic view showing a sensing device 1' according to still another embodiment of the invention. As shown in FIG. 5, this embodiment is similar to FIG. 1 except for the following differences. The interposer structure 20 of FIG. 1 is formed by a semiconductor substrate, and the interposer structure 20' of this embodiment is a flexible circuit board made of polyimide, and at least one metal layer is provided in the flexible circuit board to achieve the object of signal connection so that the signals can be outputted to the output pads 25'. Therefore, the wire-bonding and encapsulating processes are not needed, and the sensing device 1' can be further thinned.

Figure 6A:
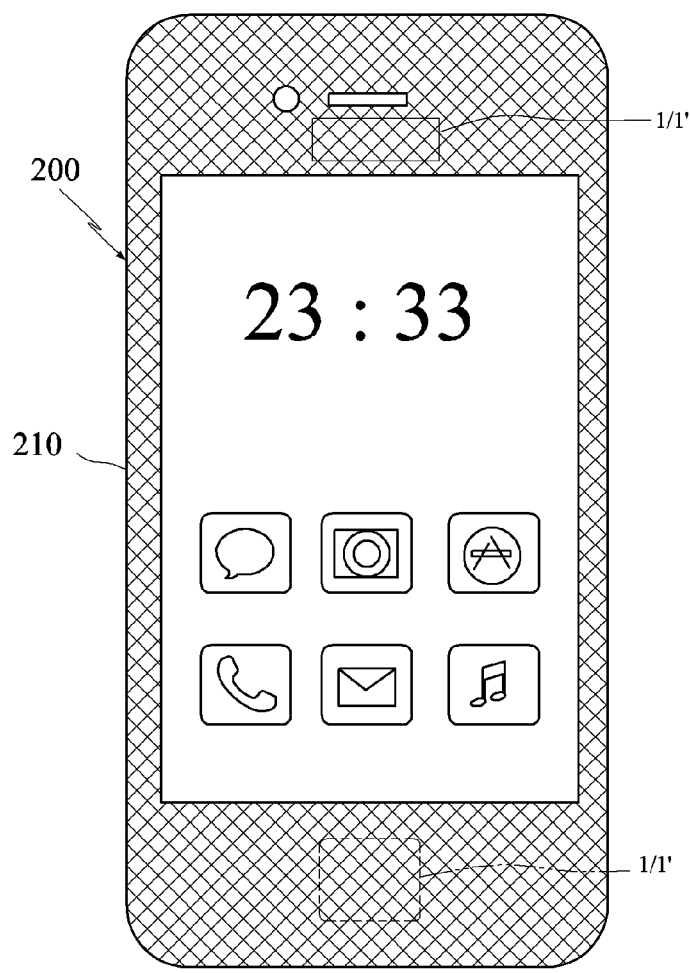
FIG. 6A is a top view showing an electronic apparatus equipped with the sensing device.
Figure 6B:
FIGS. 6B and 6C show two examples of mounting positions of the sensing device.
Figure 6C:
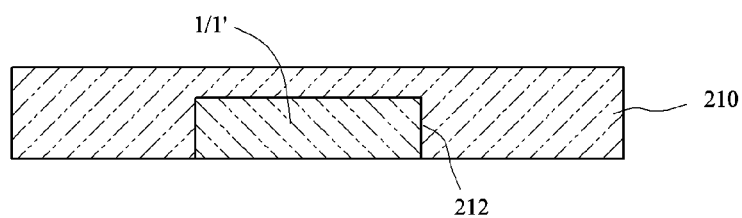

FIG. 6A is a top view showing an electronic apparatus 200 equipped with the sensing device. FIGS. 6B and 6C show two examples of mounting positions of the sensing device. As shown in FIG. 6A, the sensing device 1 of the embodiment can be mounted under the panel or cover of the mobile phone, for example. Because the user pays great attention to the outlook of the mobile phone, it is a key feature of the invention to hide the sensing device below the panel or cover 210. Thus, the sensing device needs to have the fully-flat surface. The sensing device of the invention may be implemented as an area-type or sweep-type fingerprint sensor mounted on the lower surface of the panel 210 (FIG. 6B) or mounted in the slot 212 of the panel 210 (FIG. 6C), so that the panel 210 has all of the touch, display and fingerprint sensing functions.

The conventional sensor uses the ball grid array (BGA) with balls each having the diameter ranging from about 300 to 400 microns, while the height of the microbump of each embodiment of the invention is about 10 microns (um), and the height of the interposer wafer ranges from about 50 to 100 um. Thus, compared with the prior art, the height (or thickness) ranging from about 200 to 300 microns can be decreased, so that the thickness of the sensing device can be smaller than or equal to 500 um, and the sensing device and the electronic apparatus having the sensing device can be thus thinned.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. An ultra-thin sensing device with a flat contact surface, the sensing device comprising:
    a package substrate comprising first bonding pads;
    an interposer structure, which is disposed on the package substrate and comprises connection pads and second bonding pads electrically connected to the first bonding pads and the connection pads;
    a vertical electrical connection structure, which is disposed on the interposer structure and comprises vertical conductors electrically connected to the connection pads; and
    a sensing chip, which is disposed on the vertical electrical connection structure and comprises a chip substrate, and sensing members, sensing circuit cells and vertical through electrodes, wherein the sensing members, the sensing circuit cells and the vertical through electrodes are formed on the chip substrate, wherein:
    the sensing members constituting a sensing member array sense specific features of an organism to obtain sensing signals;
    the sensing circuit cells, constituting a sensing circuit cell array and electrically connected to the sensing members, process the sensing signals into biometrics feature signals; and
    the vertical through electrodes are directly or indirectly electrically connected to the sensing circuit cells and the vertical conductors, so that the biometrics feature signals are transmitted to the first bonding pads through the vertical through electrodes, the vertical conductors and the second bonding pads, respectively.

2. The sensing device according to claim 1, further comprising:
    wires electrically connecting the first bonding pads to the second bonding pads; and
    an encapsulating layer covering the first bonding pads, the second bonding pads and the wires, wherein the vertical electrical connection structure further comprises an insulation filler layer, and the vertical conductors are buried in the insulation filler layer.

3. The sensing device according to claim 1, wherein:
    a thickness of the sensing device is smaller than or equal to 500 microns.

4. The sensing device according to claim 1, wherein the vertical conductor is made of copper, nickel, silver and solder.

5. The sensing device according to claim 1, wherein:
the sensing chip further comprises a redistribution layer, and the vertical through electrodes are electrically connected to the vertical conductors through the redistribution layer; and
the vertical electrical connection structure further comprises dummy electroconductive structures electrically connected to the redistribution layer, wherein the dummy electroconductive structures do not transmit any signal.

6. A method of manufacturing a sensing device, comprising the steps of:
(a) forming sensing chips each having a chip substrate and sensing members, sensing circuit cells and vertical through electrodes formed in the chip substrate, wherein the sensing circuit cells are electrically connected to the vertical through electrodes and the sensing members;
(b) forming a redistribution layer on the vertical through electrodes and forming vertical conductors on the redistribution layer;
(c) forming an interposer wafer having connection pads and second bonding pads electrically connected to the connection pads;
(d) placing the sensing chips on the interposer wafer with the vertical conductors being aligned with the connection pads;
(e) bonding the vertical conductors to the connection pads;
(f) forming an insulation filler layer between the sensing chips and the interposer wafer;
(g) performing a dicing process to form sensors;
(h) placing the sensor on a package substrate comprising first bonding pads; and
(i) performing wire-bonding and encapsulating processes on the sensor to electrically connect the first bonding pads to the second bonding pads and form the sensing device.

7. The method according to claim 6, wherein the step (a) comprises:
(a1) forming the sensing circuit cells on the chip substrate;
(a2) forming an inter-layer dielectric layer on the chip substrate and the sensing circuit cells;
(a3) forming through holes, which penetrate through the inter-layer dielectric layer and extend into the chip substrate by a predetermined depth;
(a4) forming a first insulating layer on the inter-layer dielectric layer and an inner wall of each of the through holes;
(a5) forming a first copper seed layer on the first insulating layer;
(a6) using the first copper seed layer to perform plating to form a first copper layer;
(a7) removing a portion of the first copper layer by way of grinding until the first insulating layer is exposed to form the vertical through electrodes;
(a8) forming the sensing members on the vertical through electrodes and the first insulating layer with the sensing members being electrically connected to the vertical through electrodes and being covered by a passivation layer;
(a9) adhering a carrier to the passivation layer and grinding the chip substrate until the vertical through electrodes are exposed;
(a10) removing the carrier and forming a second insulating layer on the chip substrate and the vertical through electrodes with the vertical through electrodes being exposed; and
(a11) forming the redistribution layer, electrically connected to the vertical through electrodes, on the second insulating layer.

8. The method according to claim 7, wherein the step (b) comprises:
(b1) forming a second copper seed layer on the redistribution layer and the second insulating layer;
(b2) using the second copper seed layer to perform plating to form a second copper layer; and
(b3) forming a solder layer on the second copper layer and removing a portion of the second copper layer, so that the solder layer serves as solder caps to be aligned with and bonded to the connection pads.

9. The method according to claim 7, wherein the step (b) comprises:
(b1) forming a third insulating layer on the redistribution layer and the second insulating layer;
(b2) forming windows on the third insulating layer to expose the redistribution layer;
(b3) forming a second copper seed layer on the redistribution layer and the third insulating layer;
(b4) using the second copper seed layer to perform plating to form a second copper layer; and
(b5) forming a solder layer on the second copper layer and removing a portion of the second copper layer, so that the solder layer serves as solder caps to be aligned with and bonded to the connection pads.

10. The method according to claim 6, wherein the step (i) comprises:
providing wires to electrically connect the first bonding pads to the second bonding pads, respectively; and
providing an encapsulating layer to cover the first bonding pads, the second bonding pads and the wires.

* * * * *